United States Patent
Frohberg et al.

(10) Patent No.: US 7,314,793 B2
(45) Date of Patent: Jan. 1, 2008

(54) TECHNIQUE FOR CONTROLLING MECHANICAL STRESS IN A CHANNEL REGION BY SPACER REMOVAL

(75) Inventors: Kai Frohberg, Meissen (DE); Matthias Schaller, Dresden (DE); Massud Aminpur, Dresden (DE); Martin Mazur, Pulsnitz (DE); Roberto Klingler, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 336 days.

(21) Appl. No.: 11/047,129

(22) Filed: Jan. 31, 2005

(65) Prior Publication Data
US 2005/0266639 A1 Dec. 1, 2005

(30) Foreign Application Priority Data
May 28, 2004 (DE) .................. 10 2004 026 142

(51) Int. Cl.
*H01L 21/8238* (2006.01)
(52) U.S. Cl. .................. 438/230; 438/595; 438/938; 257/E21.64
(58) Field of Classification Search ............. 438/230, 438/233, 595, 910, 938
See application file for complete search history.

(56) References Cited

U.S. PATENT DOCUMENTS

| | | | |
|---|---|---|---|
| 7,053,400 B2 * | 5/2006 | Sun et al. | 257/19 |
| 7,164,189 B2 * | 1/2007 | Huang et al. | 257/632 |
| 2003/0040158 A1 | 2/2003 | Saitoh | 438/279 |
| 2004/0029323 A1 | 2/2004 | Shimizu et al. | 438/142 |

OTHER PUBLICATIONS

Shimizu, "Local Mechanical-Stress Control (LMC): A New Technique for CMOS-Performance Enhancement", 2001 IEEE.*

* cited by examiner

*Primary Examiner*—Chandra Chaudhari
(74) *Attorney, Agent, or Firm*—Williams, Morgan & Amerson, P.C.

(57) ABSTRACT

During the formation of a transistor element, sidewalls spacers are removed or at least partially etched back after ion implantation and silicidation, thereby rendering the mechanical coupling of a contact etch stop layer to the underlying drain and source regions more effective. Hence, the mechanical stress may be substantially induced by the contact etch step layer rather than by a combination of the spacer elements and the etch stop layer, thereby significantly facilitating the stress engineering in the channel region. By additionally performing a plasma treatment, different amounts of stress may be created in different transistor devices without unduly contributing to process complexity.

14 Claims, 5 Drawing Sheets

TECHNIQUE FOR CONTROLLING MECHANICAL STRESS IN A CHANNEL REGION BY SPACER REMOVAL

BACKGROUND OF THE INVENTION

1. Field of the Invention

Generally, the present invention relates to the formation of integrated circuits, and, more particularly, to the formation of a field effect transistor that has induced mechanical stress in its channel region for device performance improvement.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region upon formation of a conductive channel, due to the application of an appropriate control voltage to the gate electrode, depends on the dopant concentration, the mobility of the charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, entails a plurality of issues associated therewith that have to be addressed to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. As a general rule, reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Irrespective of the technological approach used, sophisticated spacer techniques are necessary to create the highly complex dopant profile and to serve as a mask in forming metal silicide regions in the gate electrode and the drain and source regions in a self-aligned fashion. Since the continuous size reduction of the critical dimensions, i.e., the gate length of the transistors, necessitates the adaptation and possibly the new development of process techniques concerning the above-identified process steps, it has been proposed to also enhance device performance of the transistor elements by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage. Second, the lattice structure in the channel region may be modified, for instance by creating tensile or compressive stress, which results in a modified mobility for electrons and holes. For example, creating tensile stress in the channel region increases the mobility of electrons, wherein, depending on the magnitude of the tensile stress, an increase in mobility of up to 20% may be obtained, which, in turn, may directly translate into a corresponding increase in the conductivity. On the other hand, compressive stress in the channel region may increase the mobility of holes, thereby providing the potential for enhancing the performance of P-type transistors. Consequently, it has been proposed to introduce, for instance, a silicon/germanium layer or a silicon/carbon layer in or below the channel region to create tensile or compressive stress. Although the transistor performance may be considerably enhanced by the introduction of stress-creating layers in or below the channel region, significant efforts have to be made to implement the formation of corresponding stress layers into the conventional and well-approved CMOS technique. For instance, additional epitaxial growth techniques have to be developed and implemented into the process flow to form the germanium or carbon-containing stress layers at appropriate locations in or below the channel region. Hence, process complexity is significantly increased, thereby also increasing production costs and the potential for a reduction in production yield.

In view of the above-described situation, there exists a need for an alternative technique that enables the creation of stress in the transistor structure without requiring complex and expensive epitaxial growth techniques.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the creation of a specified mechanical stress within a transistor element, for instance, particularly within the channel region of the transistor element, by coordinating the formation process for two components, i.e., a spacer element of the gate electrode structure and a dielectric etch stop layer used for forming contact openings after the completion of the transistor element, both of which have a significant influence on the stress creation due to their close proximity to the channel region of the transistor element. As previously discussed, usually sophisticated spacer techniques are required to provide precisely determined process conditions during the formation of drain and source implantation regions and silicide regions, thereby offering little flexibility in designing spacer and spacer formation processes also under consideration of stress-associated aspects. According to the present invention, the removal of at least a portion of the spacer element after having completed the transistor element provides enhanced flexibility in the stress creation, since the final desired stress may be more effectively adjusted by the subsequent formation of the etch stop layer due to the increased exposed portions, which are now available for the transfer of stress from the etch stop layer to the gate structure and the channel region.

According to one illustrative embodiment of the present invention, a method comprises forming a transistor element in a semiconductor region and forming a first spacer element adjacent sidewalls of a gate electrode structure of the transistor element. Furthermore, a metal compound is formed in the gate electrode structure and portions of the semiconductor region not covered by the gate electrode structure and the spacer element. Then, at least a portion of the spacer element is removed and a first dielectric layer is formed over the transistor element, wherein the dielectric layer exerts a first specified stress level to a channel region of the transistor element.

According to another illustrative embodiment of the present invention, a semiconductor device comprises a first transistor element having a first channel region with a first specified mechanical stress. The semiconductor device further comprises a second transistor element having a second channel region with a second specified mechanical stress other than the first mechanical stress, wherein the first and second channel regions are formed from the same crystalline semiconductor material.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that an effective "stress engineering" of a transistor element may be accomplished by controlling the formation process and/or the dimensions of transistor components having a highly significant influence on the finally obtained stress in the channel region. That is, spacer elements typically used for controlling an ion implantation sequence for defining source and drain regions and serving as a mask during the formation of metal silicide regions in a self-aligned fashion, and a dielectric etch stop layer used for controlling an etch process for forming contact openings to the transistor element are located adjacent to the channel region and thus significantly affect the stress therein. In the present invention, at least one spacer element is removed, partially or completely, to reduce the effect of the reduced or removed spacer element on the stress creation in the channel region, which is then substantially determined by the contact etch stop layer, thereby significantly facilitating the control of the total stress of the transistor element having the reduced or removed spacer element.

Figure 1A:
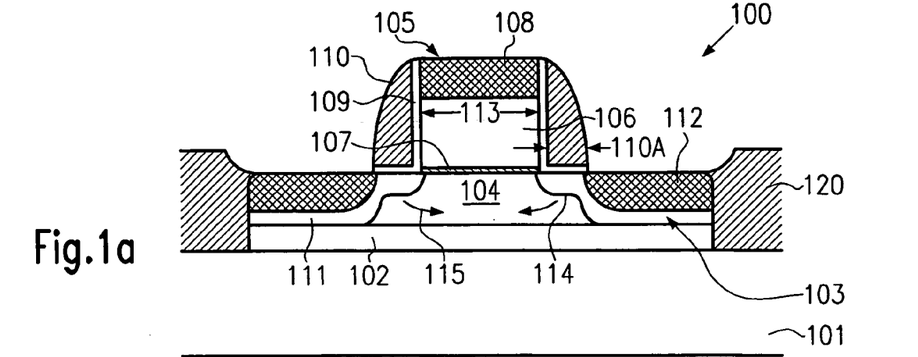
FIGS. 1a-1c schematically show cross-sectional views of a transistor element during various manufacturing stages, wherein stress in a channel region is adjusted by removing a portion of a spacer element in combination with the deposition of a contact etch stop layer having a specified intrinsic stress.

With reference to the drawings, further illustrative embodiments of the present invention will now be described in more detail. FIG. 1a schematically shows a cross-sectional view of a transistor element 100 comprising a substrate 101 having formed thereon a crystalline semiconductor layer 103, which may represent a silicon layer if silicon-based semiconductor devices are considered. It should be appreciated, however, that the semiconductor layer 103 may comprise any appropriate material composition or layer composition as is deemed suitable for the transistor element 100 with respect to design and performance requirements. Since the majority of sophisticated semiconductor devices, such as CPUs, memory chips, ASICs and the like, are manufactured on the basis of silicon, the further specification will refer to the layer 103 as a silicon layer, wherein the present invention is, however, not limited to silicon unless such restrictions are explicitly set forth in the appended claims.

The semiconductor layer 103 may be separated from the substrate 101 by an insulating layer 102, such as a silicon dioxide layer, when the transistor element 100 is to represent a silicon-on-insulator (SOI) device. In other embodiments, the transistor element 100 may represent a device formed on a bulk silicon substrate, wherein the semiconductor layer 103 may represent an upper surface portion thereof or a semiconductor portion epitaxially grown on the bulk substrate. The transistor element 100 further comprises an isolation structure 120, for instance provided as a shallow trench isolation, to insulate the transistor element 100 from other devices formed on the substrate 101. Furthermore, a gate electrode structure 105 is formed above the semiconductor layer 103 and separated therefrom by a gate insulation layer 107. The gate electrode structure 105 may be comprised of a polysilicon portion 106 and a metal silicide portion 108, wherein the metal silicide may contain cobalt silicide, nickel silicide, or any other appropriate material composition having a low electrical resistivity.

As previously discussed, stress engineering may be particularly advantageous for extremely scaled transistor devices, and hence a dimension 113 of the gate electrode structure 105 along a transistor length direction, also refereed to as gate length 113, may be significantly less than 100 nm, and may be approximately 45 nm for semiconductor devices manufactured by a 90 nm technology that is currently employed in modern CPUs and memory chips. Moreover, the transistor element 100 comprises source and drain regions 111, possibly including respective extension regions 114, wherein the source and drain regions 111 are separated by a channel region 104 that is inversely doped compared to the source and drain regions 111 and also exhibit a significantly lower dopant concentration. Moreover, sidewall spacers 110 are formed adjacent the sidewalls of the gate electrode structure 105 and may be separated therefrom and from the semiconductor layer 103 by a liner 109 having a material composition that differs from that of the sidewall spacer 110. For instance, the sidewall spacers 110 may be comprised of silicon nitride and the liner 109 may be formed from silicon dioxide. However, other material compositions for the sidewall spacers 110 and the liner 109 may be selected in accordance with design and performance requirements. For instance, the sidewall spacer 110 may be comprised of silicon dioxide, while the liner 109 may be formed from silicon nitride.

At this manufacturing stage, a mechanical stress 115 within the channel region 104 is substantially determined by the stress created by the sidewall spacers 110. For instance, if the sidewall spacers 110 are comprised of silicon nitride, compressive or tensile stress may be created during the formation of the sidewall spacers 110, depending on the design requirements. For instance, the sidewall spacers 110 may comprise compressive stress, thereby inducing the compressive stress 115 within the channel region 104, which may be advantageous for P-type transistors, as the compressive stress 115 may enhance the hole mobility in the channel region 104.

A typical process flow for forming the transistor element 100 as shown in FIG. 1a may include the following processes. First, the semiconductor layer 103 may be formed by an epitaxial growth process or by sophisticated wafer bond techniques. Thereafter, the gate insulation layer 107 is formed by deposition and/or oxidation on the basis of well-established process techniques. Next, gate electrode material is deposited, for instance in the form of polysilicon, by low pressure chemical vapor deposition (LPCVD) in accordance with well-known recipes. Thereafter, the gate electrode material and the gate insulation layer 107 are patterned by sophisticated photolithography and etch techniques on the basis of well-established processes. The extension region 114, if required, may be formed, possibly by forming any offset spacers (not shown), followed by the formation of the liner 109 and a spacer layer that is subsequently patterned by anisotropic etching of the spacer layer to obtain the sidewall spacers 110. The deposition of the spacer layer for forming the sidewall spacers 110 may be performed on the basis of well-established process recipes on the basis of silane ($SiH_4$) and ammonia ($NH_3$), nitrogen oxide ($N_2O$) or nitrogen ($N_2$) in a deposition tool for plasma enhanced chemical vapor deposition (PECVD) for a silicon nitride layer, thereby adjusting a spacer width 110a by selecting the initial layer thickness of the spacer layer. Moreover, the stress in the sidewall spacers 110 may be determined by the deposition conditions, wherein, for instance, a compressive stress in silicon nitride of approximately 150 MPa may be obtained with well-approved deposition recipes, while, in other embodiments, a tensile stress of approximately 0-1000 MPa may beachieved. In general, the stress created in the silicon nitride during the deposition depends on the gas mixture, the deposition rate, the temperature and the ion bombardment. According to well-known recipes, the corresponding amount of tensile or compressive stress in the spacer layer may be adjusted by, for instance, varying process parameters determining the plasma atmosphere during the deposition of the spacer layer by plasma enhanced chemical vapor deposition. In particular, the bias energy supplied to the plasma atmosphere may be varied to adjust the degree of ion bombardment during the deposition process, thereby creating tensile or compressive stress in the silicon nitride layer. To create a desired ion bombardment, dual frequency CVD reactors are usually used to adjust a desired amount of bias power. For example, if the low frequency supply is significantly reduced or turned off, a silicon nitride spacer layer having a tensile stress is created. On the other hand, moderately high bias power creates compressive stress in the silicon nitride layer. A corresponding deposition process may be performed with any deposition tool that enables the generation of an appropriate plasma atmosphere.

After the formation of the sidewall spacers 110, the source and drain regions 111 may be formed by ion implantation while using the gate electrode structure 105 and the sidewall spacers 110 as an implantation mask. It should be noted that although a single sidewall spacer 110 is shown in FIG. 1a, two or more distinct spacer elements may be provided to create a more sophisticated implantation mask if a more pronounced lateral profiling of the drain and source regions 111 is required. That is, in some embodiments, the sidewall spacer 110 may be comprised of two or more spacer elements separated from each other by respective liners. Regarding the formation of the individual spacer elements including their intrinsic mechanical stress, the same criteria apply as explained above with reference to the sidewall spacer 110.

After the implantation cycles for forming the drain and source regions 111, any anneal sequences may be performed to activate dopants and cure, at least partially, lattice damage created during the implantation. Thereafter, the metal silicide regions 108, 112 may be formed by depositing an appropriate refractory metal and initiating a chemical reaction with the underlying silicon or semiconductor material, wherein the sidewall spacer 110 acts as a reaction mask, since substantially no reaction occurs between the refractory metal and the material of the sidewall spacer 110, so that after the chemical reaction the non-reacted refractory metal may be readily removed by well-known selective etch techniques, thereby avoiding the formation of any conductive paths between the gate electrode structure 105 and the drain and source regions 111. In some embodiments, the sidewall spacer 110 may be recessed during the anisotropic etch process for forming the sidewall spacer 110, thereby exposing upper sidewall portions of the liner 109, which may then also be removed to expose upper sidewall portions of the gate electrode structure 105. In this case, the chemical reaction between the refractory metal and the polysilicon 106 may be enhanced to create an enlarged metal silicide region 108 in the gate electrode structure 105. The degree of recessing of the sidewall spacer 110 is determined by the amount of blocking effect required during the implantation cycles, and hence the sidewall spacer 110 may not be recessed in an arbitrary fashion. In other embodiments, the sidewall spacer 110 may be recessed after the formation of the drain and source regions 111 and prior to forming the metal silicide regions 108 and 112. In this case, the degree of recessing of the sidewall spacer 110 is determined by the required masking effect during the chemical reaction between the refractory metal and the semiconductor material in the gate electrode structure 105 and the drain and source regions 111 to reliably avoid the formation of any conductive paths between these regions.

Figure 1B:
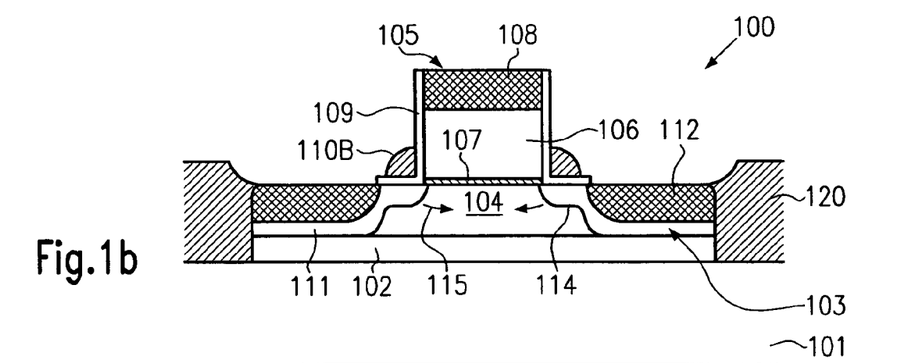

FIG. 1b schematically shows the transistor element 100 after removing a portion of the sidewall spacer 110, shown in FIG. 1a, to obtain a reduced or recessed sidewall spacer 110b, wherein, in the embodiment shown in FIG. 1b, the liner 109 is substantially maintained. In this case, removing a portion of the sidewall spacer 110 (FIG. 1a) may be performed after the formation of the metal silicide regions 108 and 112 by a selective etch process, wherein the liner 109 acts as an etch stop layer. For instance, when the sidewall spacer 110 is comprised of silicon nitride, a selective etch process may be performed on the basis of hot phosphoric acid. During removal of a portion of the sidewall spacer 110, a resist mask (not shown) may be formed to cover the source and drain regions 111, as will also be explained later with reference to FIG. 2b.

Since the metal silicide regions 108 and 112 may be formed prior to the removal of a portion of the sidewall spacer 110 according to one particular embodiment, the dimensions of the reduced sidewall spacer 110b may be selected in accordance with stress engineering requirements, since a masking effect of the sidewall spacer 110b for any implantation or silicidation is no longer required. Thus, in some embodiments, the sidewall spacer 110 may substantially be completely removed. In other embodiments, when the reduced sidewall spacer 110b is formed after the implantation of the source and drain regions 111 and prior to the formation of the metal silicide regions 108 and 112, the dimensions may be selected such that the reduced sidewall spacer 110b still reliably prevents the creation of a conductive path during the silicidation process. It should be appreciated in this case that the liner 109 may also be removed to expose enlarged portions of the semiconductor layer 103 and the polysilicon line 106. A corresponding removal of exposed portions of the liner 109 may be accomplished by a wet etch process on the basis of diluted fluoric acid, if the liner is comprised of silicon dioxide.

In view of an enhanced flexibility in reducing the effect of the sidewall spacer 110b on the total stress 115 created in the channel region 104, it may be preferable to reduce or remove the sidewall spacer 110 (FIG. 1a) after the formation of the metal silicide regions 108 and 112, as is shown in FIG. 1b. Irrespective of the process for reducing or removing the sidewall spacer 110, the stress in the channel region 104 at this manufacturing stage is significantly reduced compared to the device of FIG. 1a, as the area available for transferring the stress from the sidewall spacer 110b to the gate electrode structure 105 and the drain and source regions 111 is significantly reduced. Consequently, the stress generation mechanism for the channel region 104 is substantially "decoupled" from the sidewall spacer 110b.

Figure 1C:
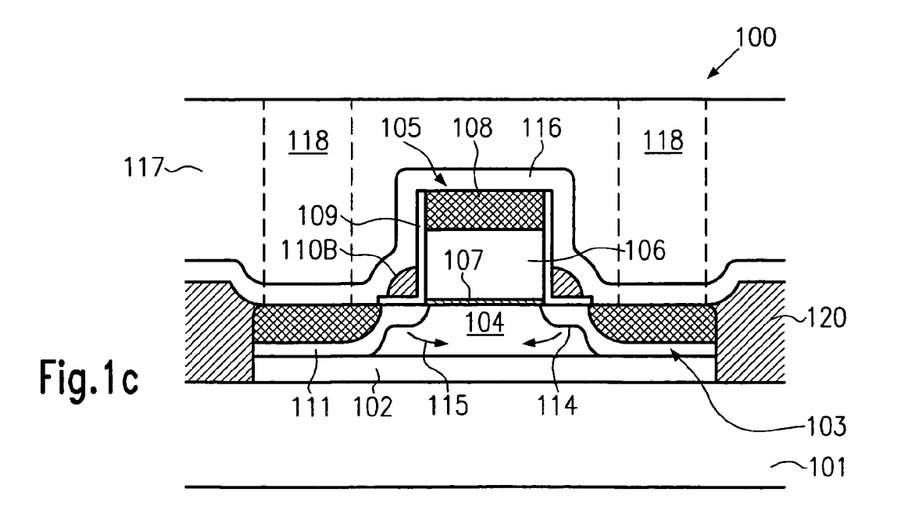

FIG. 1c schematically shows the transistor element 100 in a further advanced manufacturing stage. The transistor element 100 further comprises a first dielectric layer 116 located above the drain and source regions 111 and formed on the gate electrode structure 105 and the reduced sidewall spacer 110b and the liner 109. The first dielectric layer 116 may be comprised of any appropriate material that may act as an etch stop layer during a subsequent contact etch process for forming contact openings 118 within a second dielectric layer 117 formed on the first dielectric layer 116. Moreover, the first dielectric layer 116 is formed to exhibit a specified mechanical stress, for instance, a specified compressive stress, which is selected such that the desired total stress 115 is created within the channel region 104. For example, the first dielectric layer 116 may be comprised of silicon nitride formed by appropriately selected deposition parameters to achieve the desired stress in the layer 116. The stress in the dielectric layer 116 may be selected in accordance with design requirements and may depend on the type of transistor that the element 100 represents. For example, the dielectric layer 116 may be formed to have inherent compressive stresses created therein, which, in turn, may be used to create a specified compressive stress 115 in the channel region 104, thereby enhancing the hole mobility if the transistor element 100 is an illustrative P-type transistor. Thereby, the finally obtained compressive stress 115 is substantially determined by the dielectric layer 116 rather than by a more complicated combination of a spacer element, such as the spacer 110 (FIG. 1a) and the corresponding etch stop layer 116, as is the case in the conventional process flow, thereby significantly facilitating the creation and control of the stress 115. Effective and reliable stress control may be advantageous for transistors having a gate length 113 of 50 nm or even less. In other embodiments, the transistor element 100 may represent an N-type transistor, wherein the initial sidewall spacer 110 (FIG. 1a) may have a compressive or a tensile stress, wherein also the finally obtained stress 115 may now substantially be adjusted by the inherent stress of the first dielectric layer 116. For example, even if the initial sidewalls spacer 110 exhibits a compressive stress, the layer 116 may be formed with intrinsic tensile stress, thereby effectively overcompensating the residual small compressive stress of the reduced spacer 110b (FIG. 1b). Similarly, the initial sidewall spacer 110 may comprise tensile stress, wherein the effect thereof is rendered negligible by reducing the sidewall spacer 110 to the reduced spacer 110b, thereby substantially determining the finally obtained tensile stress 115 by the dielectric layer 116 rather than by a combination of the spacer 110 and the layer 116 in the same way as is explained with reference to the compressive stress shown in FIG. 1c.

A typical process flow for forming the transistor element 100 as shown in FIG. 1c may comprise the following processes. After the formation of the first dielectric layer 116 by well-established PECVD techniques, wherein process parameters are adjusted to create a desired inherent stress in the layer 116, the dielectric layer 117 is deposited, for instance in the form of silicon dioxide, with plasma enhanced chemical vapor deposition. Thereafter, the contact openings 118 may be formed by a corresponding photolithography and anisotropic etch techniques, as are well known in the art, wherein the layer 116 is used as an etch stop layer. For convenience, a contact opening for the gate electrode structure 105 having a reduced depth compared to the openings 118 is not shown, as it may typically lie in a different plane with respect to the transistor width direction, that is, the direction perpendicular to the drawing plane of FIG. 1c.

As a result, due to the partial or complete removal of the sidewall spacer 110 after the masking effect thereof is no longer required, an enhanced flexibility in designing the stress in the channel region 104 is achieved, thereby also enabling an improved control of the transistor performance.

Figure 1D:
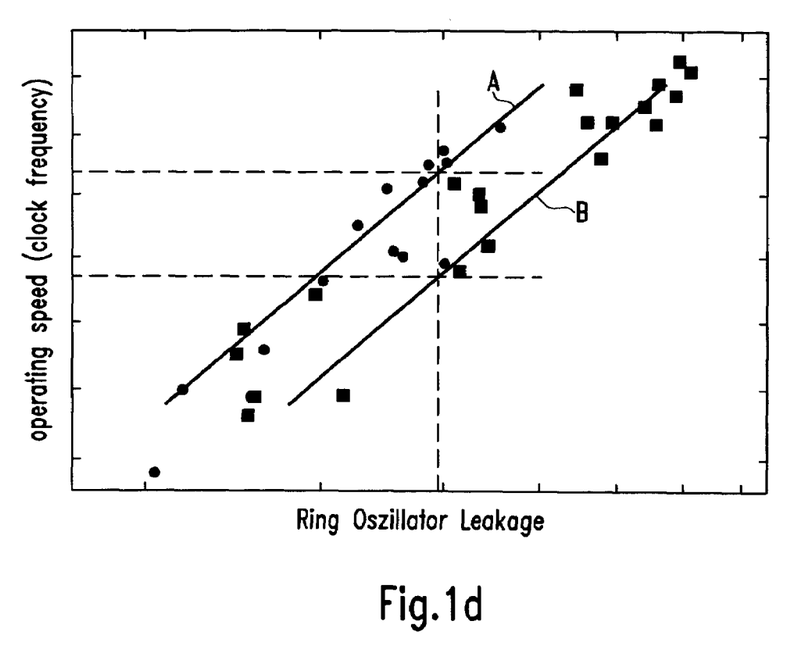
FIG. 1d schematically shows a graph illustrating measurement results for a semiconductor device formed in a conventional manner and in accordance with illustrative embodiments of the present invention.

FIG. 1d schematically shows a graph representing the measurement results for a plurality of transistor elements 100 formed in accordance with the above-described embodiments in comparison to conventionally fabricated transistor elements having the same design rules, in which the stress generation in the respective channel regions is, however, achieved by a conventional design without reducing or removing the sidewall spacer after the completion of the basic transistor structure. For estimating the performance, corresponding test circuits were formed by means of a plurality of transistor elements connected to form a ring oscillator, wherein the operating speed of the ring oscillator, i.e., the clock signal frequency, is varied and the resulting leakage current of the ring oscillator circuit is monitored. Curve A in FIG. 1d represents a fit curve for measurement results referring to transistor elements 100 in accordance with the present invention, while curve B represents the fit curve of the measurement results of the conventional devices. As is evident from FIG. 1d, a significant speed improvement is obtained for the same leakage level, thereby indicating an increased transistor performance. The measurement results may be interpreted such that, for a given basic transistor design, i.e., a given gate length, a given thickness of the gate insulation layer 107, and a given design of the drain and source regions, an increased conductivity of the channel region 104 may be obtained, while the leakage currents, which are substantially given by the geometric configuration of the gate structure and the characteristics of the PN junctions defined by the drain and source regions, substantially remain unchanged. The improvement in the device performance may be obtained for one type of transistor elements, that is, for N-transistors or P-transistors, where the improvement of one transistor type also increases the total device performance. Moreover, in semiconductor devices having formed therein substantially one type of transistors, for example NMOS devices, the overall performance enhancement may be even higher.

With reference to FIGS. 2a-2f, further illustrative embodiments will be described in more detail, wherein the stress engineering in one transistor may be performed similarly as described with reference to FIGS. 1a-1c, while substantially avoiding any influence of the stress engineering of the first transistor on a second transistor.

Figure 2A:
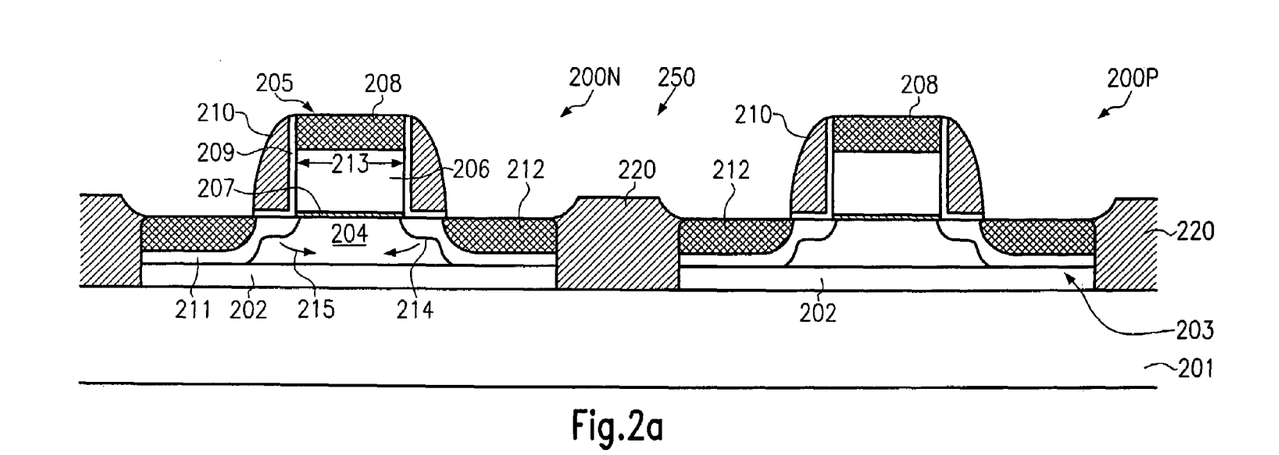
FIGS. 2a-2f schematically show cross-sectional views of a semiconductor device during various stages of a manufacturing process, wherein two transistor elements formed in a common formation process exhibit different mechanical stresses within their respective channel regions.

In FIG. 2a, a semiconductor device 250 comprises a first transistor element 200n and a second transistor element 200p, both of which have a similar configuration as is also shown in FIG. 1a. Thereby, the first transistor 200n may represent an N-type transistor, while the second transistor 200p may represent a P-type transistor. However, the transistors 200n, 200p may represent transistors of the same type or different types, which are spaced apart at moderately large distances within the same die or in different dies. For instance, if speed variations across a wafer are monitored, different regions of the wafer may require a different channel stress to provide a more uniform speed distribution.

The first transistor 200n comprises the substrate 201, an insulating layer 202, and a semiconductor layer 203. A gate structure 205 is formed above the layer 203, separated therefrom by a gate insulation layer 207, wherein the gate electrode structure 205 may include a polysilicon line 206 and a metal silicide region 208. A spacer element 210 is formed at sidewalls of the gate electrode structure 205 and is separated therefrom by a liner 209. Drain and source regions 211, possibly including extension regions 214, are formed in the semiconductor layer 203 and are separated from each other by a channel region 204.

The second transistor 200p may comprise the same components, wherein the conductivity type of the channel region 204 and the drain and source regions 211 may be inverse compared to the respective regions of the first transistor 200n, if the transistors 200n, 200p represent a complementary transistor pair, formed in close proximity to each other and separated by a shallow trench isolation 220.

Regarding the manufacturing processes, the same techniques and recipes may be used as described with reference to the transistor element 100 shown in FIG. 1a.

Figure 2B:
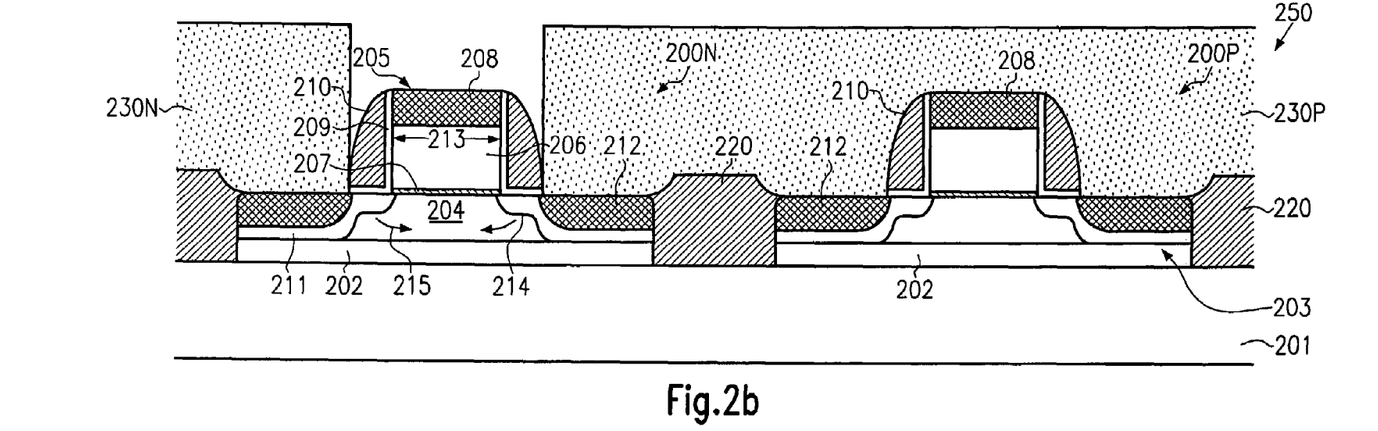

FIG. 2b schematically shows the semiconductor device 250 with respective resist masks 230n and 230p, wherein the resist mask 230n is designed to substantially expose the first transistor 200n, while the resist mask 230p substantially completely covers the second transistor 200p. The resist masks 230n and 230p may be formed by well-established photolithography techniques, wherein any overlay concerns regarding the resist mask 230n are less critical, as the subsequent etch process may be performed as a selective etch process with merely a reduced attack of the metal silicide regions 208 and 212, so that any exposed portions of the metal silicide regions 212 that are caused by a slight misalignment of the resist mask 230n may not create severe damage at the underlying areas. Moreover, it should be appreciated that the spacer element 210 of the first transistor 200n may be recessed to a certain degree prior to the formation of the metal silicide regions 208, 212, as is also explained with reference to FIGS. 1a and 1b. Hence, in a subsequent selective etch process using the mask 230n, the etch time may therefore be selected correspondingly shorter to achieve the desired material removal of the spacer elements 210, thereby further relaxing any constraints with respect to alignment errors for forming the resist mask 230n. In some embodiments, when material damage in the metal silicide region 208 is less critical, the etch process for removing material of the spacer element 210 may be performed as an anisotropic etch process rather than a highly selective wet chemical process.

Figure 2C:
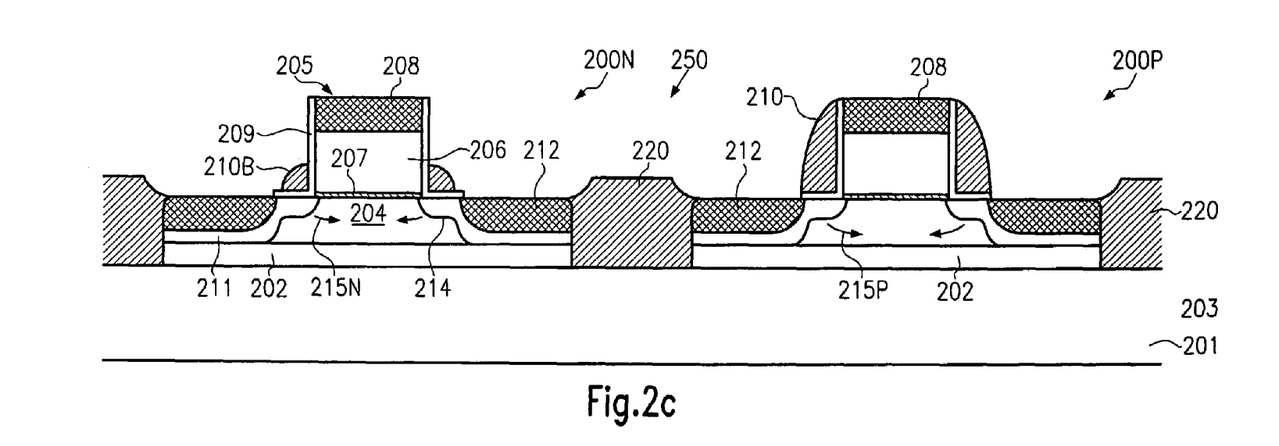

FIG. 2c schematically shows the semiconductor device 250 after the etch process for removing a portion of the spacer element 210 is completed and the resist masks 230n and 230p are removed. Thus, in the embodiment shown in FIG. 2c, a reduced spacer element 210b is formed, while, in other embodiments, the spacer 210 may be substantially completely removed. Consequently, any stress 215n in the channel region 204 of the transistor 230n due to the spacer 210 is effectively reduced, wherein a mechanical stress 215p in the transistor 200 is still substantially determined by the inherent stress, for instance compressive stress, existing in the spacers 210 of the transistor 200p. When representing a P-type transistor, the transistor 200p may preferably have a compressive stress 215p in the channel region 214 to enhance the mobility of the holes. However, the transistor 200p may represent any other type of transistor, such as an N-type transistor, wherein, for instance, the initial stress created during the formation of the spacer elements 210 is tensile, thereby creating a tensile stress in the respective channel region 204, whereas the tensile stress is then substantially reduced in the transistor 200n.

Figure 2D:
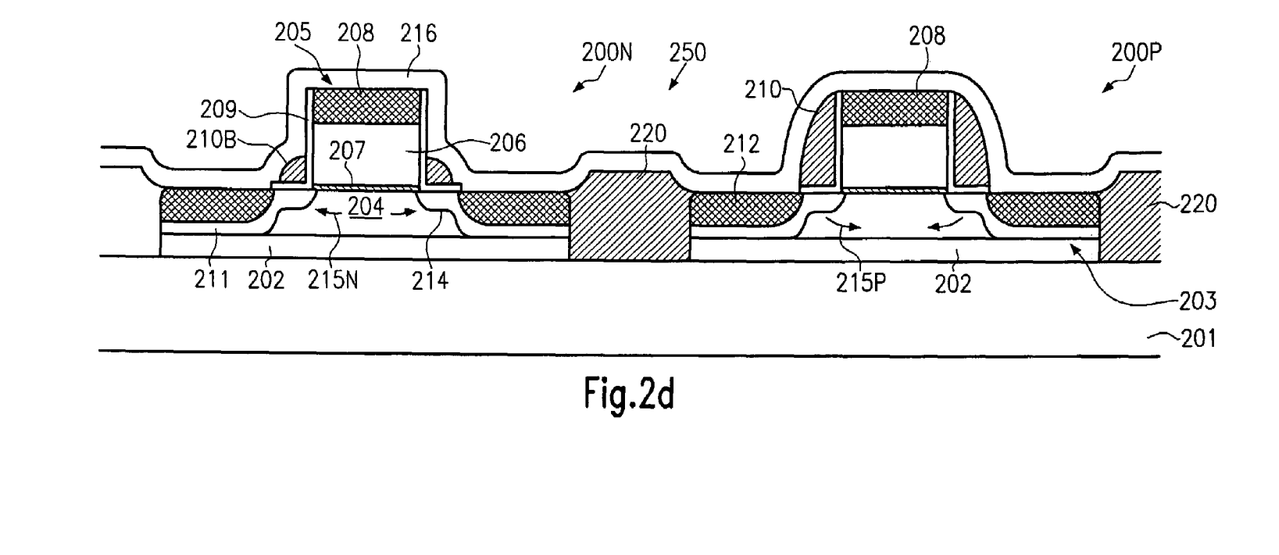

FIG. 2d schematically shows the semiconductor device 250 with a first dielectric layer 216 formed thereon, which is to act as an etch stop layer in a subsequent process for forming contact openings to the drain and source regions 211 and the gate electrode structure 205. The dielectric layer 216 may be provided, for instance, as a silicon nitride layer, the intrinsic stress of which may be adjusted by correspondingly selecting the deposition parameters, as is previously explained. For example, the silicon nitride 216 layer may be deposited with a specified tensile stress when the first transistor 200n represents an N-type transistor to create a tensile stress 215 within the respective channel region 204, wherein the control of the magnitude of the tensile stress is substantially determined by the dielectric layer 216 due to the enlarged surface area enabling an effective mechanical coupling of the layer 216 to the underlying source and drain regions 211. In one embodiment, the stress in the channel region 204 of the first transistor 200n may be adjusted to a correspondingly low value obtained by the reduced spacer element 210b in that the dielectric layer 216 is subjected to a directed plasma treatment, thereby significantly relaxing the stress in the layer 216. Consequently, a relatively low amount of stress may remain in the transistor 200n, while still a significant amount of stress is present in the second transistor 200p. For example, if the first transistor 200n represents an N-type transistor, a reduced compressive stress or substantially zero stress may be appropriate due to the inherently higher mobility of electrons compared to the reduced mobility of the holes in the P-type transistor 200p. Thus, in some embodiments, it may be considered appropriate to maintain a moderately high compressive stress in the P-transistor while reducing or nullifying the compressive stress in the N-type transistor to achieve a substantially symmetric electrical behavior. To this end, the dielectric layer 216 may be deposited with none or at least a very small amount of inherent stress, or, in other embodiments, the dielectric layer 216 may be deposited with compressive or tensile stress in accordance with conventional process recipes and relaxing the inherent stress by a corresponding plasma treatment with, for example, non-reactive ions such as argon or helium. A corresponding plasma treatment may be performed in any appropriate plasma etch tool or deposition tool equipped for establishing a directive plasma atmosphere. In other embodiments, the dielectric layer 216 may be relaxed by an ion bombardment generated by an ion implantation tool on the basis of moderately small implantation energies and a moderately high dose with ion species, such as xenon, germanium, and the like.

For the further description, it is assumed that the dielectric layer 216 may comprise intrinsic tensile stress to create the stress 215n as a tensile stress to increase an electron mobility in the channel region 204 of the transistor 200n.

Figure 2E:
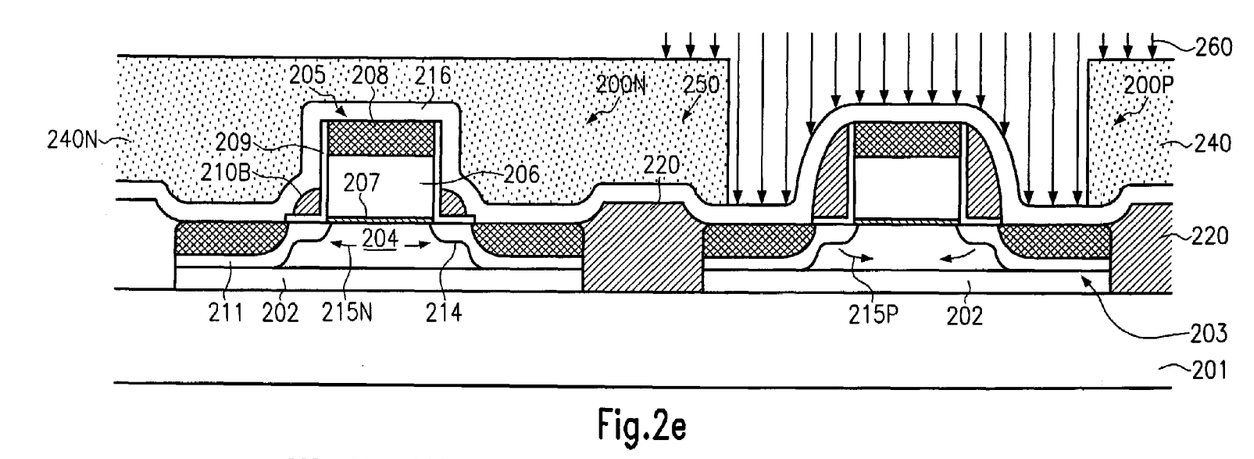

FIG. 2e schematically shows the semiconductor device 250 with a resist mask 240n formed over the first transistor 200n and a resist mask 240p formed over the second transistor 200p, wherein the resist mask 240p exposes essential portions of the dielectric layer 216 above the transistor structure. The resist masks 240n and 240p may be formed by photolithography on the basis of a mask set that may also be used for selectively forming the drain and source regions of the transistors 200n and 200p, thereby keeping additional process complexity at a low level. Exposed portions of the second transistor 200p are subjected to an ion bombardment 260 to relax or reduce the inherent tensile stress in the exposed portion of the layer 216, thereby substantially maintaining the compressive stress 215p induced by the intact spacer elements 210 of the transistor 200p. The ion bombardment may be performed by ion implantation or plasma treatment, wherein for instance implantation energy and dose are adapted to the thickness of the layer 216 and the type of ion species used. Similarly, the parameters of a directive plasma atmosphere may be selected on the basis of the layer characteristics. Appropriate parameter values may readily be obtained by tests and/or simulation calculation.

Figure 2F:
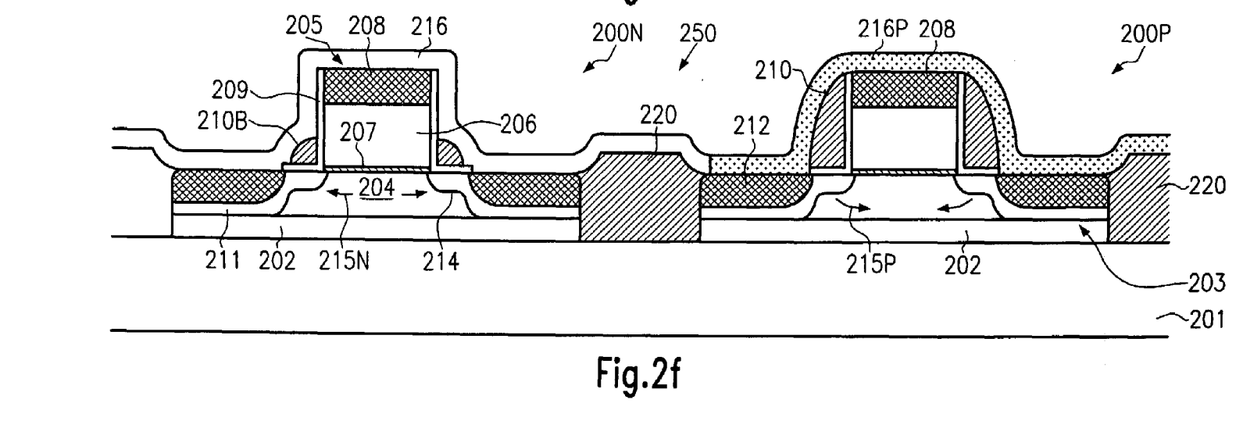

FIG. 2f schematically shows the semiconductor device 250 with the resist masks 240n and 240p removed, wherein the tensile stress still present in the dielectric layer 216 induces the tensile stress 215n in the channel region 204 of the transistor 200n, whereas a substantially relaxed dielectric layer 216p is formed over the second transistor 200p, and does not substantially influence the compressive stress 215p created by the spacer elements 210. It should be appreciated, however, that any other appropriate configuration of stress differences between the first transistor 200n and the second transistor 200p may be accomplished by the above-described embodiments, wherein an enhanced stress control is accomplished in one transistor by significantly reducing the effect of the spacer elements, while the second transistor 200p is formed substantially without being affected by the influence of the dielectric layer 216, thereby ensuring a high design flexibility and a high degree of reliability and reproducibility in creating different stress levels in different transistor devices. In other embodiments, a combined effect of the sidewalls spacer elements 210 and the dielectric layer 216 may be employed if a high mobility for a specified charge carrier type is required in one transistor, whereas a moderately high intrinsic mobility is sufficient in the other transistor. For example, the layer 216 may be deposited with compressive stress to even enhance the compressive stress 215p, wherein the layer 216 over the transistor 200n is relaxed by ion bombardment so that in combination with reduced spacers 210b the channel region is substantially stress free, thereby also enhancing the performance compared to a conventional N-type transistor having a compressive spacer and a compressive contact etch stop layer.

As previously explained, raised drain and source regions are frequently provided for sophisticated transistors. The present invention is also applicable to such a transistor configuration without substantial modification of the above-described processes.

As a result, the present invention provides a technique that enables the formation of a transistor device with an increased flexibility and control of the stress in the respective channel region by removing at least a portion of a sidewall spacer, or by removing the sidewall spacer completely to reduce or avoid any influence of the sidewall spacer on the stress created in the channel region. Hence, the stress may be transferred and controlled more effectively by a correspondingly designed contact etch stop layer. Furthermore, by means of an ion bombardment for partially or completely relaxing the contact etch stop layer, different amounts of mechanical stress may be accomplished at different substrate regions without unduly contributing to process complexity. The present invention thus provides the potential for improving the device performance on a "local scale" by, for example, providing tensile stress in N-transistors and compressive stress in P-transistors, and also enhance device uniformity at a "global scale," that is, across the substrate or from substrate to substrate by adapting the stress level of different substrate positions in a different manner. Even a multistep stress adaptation may be achieved in that, for instance, the layer stress relaxation, described with reference to FIG. 2e is performed with subsequent ion bombardment steps each using a differently designed resist mask. Thus, the stress engineering may be performed on the basis of stress measurements and/or electrical data of previously processed substrates, thereby contributing to enhanced performance and yield for sophisticated semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a transistor element in a semiconductor region;
   forming a first spacer element adjacent sidewalls of a gate electrode structure of said transistor element;
   forming a metal compound in said gate electrode structure and portions of said semiconductor region not covered by said gate electrode structure and said first spacer element;
   forming a mask to expose said gate electrode structure and said first spacer element while substantially covering said metal compound disposed in said semiconductor region not covered by said gate electrode structure and said first spacer element;
   selectively etching said first spacer element exposed by said mask to remove at least a portion of said first spacer element; and
   forming a first dielectric layer over said transistor element, said first dielectric layer exerting a first specified stress level in a channel region of said transistor element.

2. The method of claim 1, further comprising adjusting a mechanical stress created by said first dielectric layer in said channel region located below said gate electrode structure by controlling a size of said removed portion of said first spacer element.

3. The method of claim 1, wherein said first specified stress is a compressive stress and said transistor element is a P-type transistor.

4. The method of claim 1, wherein said first specified stress is a tensile stress and said transistor element is an N-type transistor.

5. The method of claim 1, wherein said first spacer element is substantially completely removed.

6. The method of claim 1, further comprising depositing a second dielectric layer above said first dielectric layer and forming a contact opening in said first dielectric layer and said second dielectric layer while using said first dielectric layer as an etch stop layer.

7. The method of claim 1, further comprising forming a second transistor element in a second semiconductor region, wherein said first dielectric layer is formed to exert a second specified stress level in a channel region of said second transistor, said second specified stress level differing from said first specified stress level.

8. The method of claim 7, further comprising covering said second transistor element when selectively etching said first spacer element.

9. The method of claim 7, wherein forming said first spacer element comprises forming a second spacer element adjacent to a second gate electrode structure of said second transistor element, said first spacer element and said second spacer element having a third specified stress level.

10. The method of claim 9, wherein said third specified stress comprises compressive stress and said first specified stress comprises tensile stress.

11. The method of claim 9, wherein said third specified stress comprises tensile stress and said first specified stress comprises compressive stress.

12. The method of claim 7, wherein at least one of said first specified stress level and said second specified stress level is adjusted by bombarding at least a portion of said first dielectric layer with ions.

13. The method of claim 12, wherein said ion bombardment for reducing a stress in said portion of said first dielectric layer is performed by forming a first resist mask exposing said portion of said first dielectric layer to a first dose of said ion bombardment.

14. The method of claim 13, further comprising removing said first resist mask and forming a second resist mask exposing a second portion of said first dielectric layer to a second dose of said ion bombardment.

* * * * *